(12) United States Patent
Hazelton

(10) Patent No.: US 7,462,958 B2
(45) Date of Patent: Dec. 9, 2008

(54) Z ACTUATOR WITH ANTI-GRAVITY

(75) Inventor: Andrew J. Hazelton, Yokohama (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 11/067,813

(22) Filed: Feb. 28, 2005

(65) Prior Publication Data

US 2006/0061219 A1   Mar. 23, 2006

Related U.S. Application Data

(60) Provisional application No. 60/611,590, filed on Sep. 21, 2004.

(51) Int. Cl.
*H02K 41/00* (2006.01)
*H02N 2/00* (2006.01)
(52) U.S. Cl. ...................................... 310/12
(58) Field of Classification Search ............ 310/12–14, 310/90; 335/53, 55, 72, 73, 75–76
See application file for complete search history.

(56) References Cited

U.S. PATENT DOCUMENTS

| 5,777,403 | A | 7/1998 | Yuan |
| 6,040,675 | A | 3/2000 | Ono |
| 6,226,075 | B1 | 5/2001 | Loopstra et al. |
| 6,337,484 | B1 | 1/2002 | Loopstra et al. |
| 6,473,161 | B1 * | 10/2002 | Cuijpers et al. ............... 355/53 |
| 6,597,429 | B2 | 7/2003 | Janssen et al. |
| 6,870,268 | B2 * | 3/2005 | Lee et al. ..................... 257/774 |
| 6,987,559 | B2 * | 1/2006 | Phillips et al. ................ 355/75 |
| 2002/0005939 | A1 | 1/2002 | Cuijpers et al. |
| 2002/0093637 | A1 * | 7/2002 | Yuan et al. .................... 355/72 |
| 2003/0173834 | A1 * | 9/2003 | McGill et al. ................. 310/12 |
| 2004/0239192 | A1 * | 12/2004 | Lilie ........................... 310/12 |
| 2004/0251748 | A1 * | 12/2004 | Inagaki et al. ................ 310/14 |

FOREIGN PATENT DOCUMENTS

| EP | 0 973 067 A2 | 1/2000 |
| EP | 1 160 628 A2 | 12/2001 |
| JP | 01314994 A * | 12/1989 |
| JP | 10225150 A * | 8/1998 |
| WO | WO 99/05573 A1 | 2/1999 |
| WO | WO 99/22272 A1 | 5/1999 |

* cited by examiner

*Primary Examiner*—Tran Nguyen
(74) *Attorney, Agent, or Firm*—Technology & Innovation Law

(57) ABSTRACT

Methods and apparatus which are suitable for actuating a stage relative to a z-axis and supporting the weight of the stage against the force of gravity are disclosed. According to one aspect of the present invention, an actuator device includes a first arrangement, a magnetic system, a piston, and a guide bearing arrangement. The first arrangement includes a yoke and a center pole, and the magnetic system includes a magnet that is coupled to the yoke as well as a coil which cooperate to function as a voice coil motor. The piston supports at least a weight associated with the first arrangement, and the guide bearing arrangement includes a planar air bearing that enables the device to move over an external surface.

28 Claims, 9 Drawing Sheets

Z ACTUATOR WITH ANTI-GRAVITY

CROSS-REFERENCE TO RELATED PATENT APPLICATION

The present application claims priority to U.S. Provisional Patent Application No. 60/611,590, filed Sep. 21, 2004, which is incorporated herein by reference in its entirety.

BACKGROUND OF THE INVENTION

1. Field of Invention

The present invention relates generally to semiconductor processing equipment. More particularly, the present invention relates to a method and an apparatus for enabling a Z-actuator and an anti-gravity device to be substantially combined in a single device.

2. Description of the Related Art

For precision instruments such as photolithography machines which are used in semiconductor processing, factors which affect the performance, e.g., accuracy, of the precision instrument generally must be dealt with and, insofar as possible, eliminated. By way of example, excessive vibration often adversely affects the performance of precision instruments. When the performance of a precision instrument such as a wafer table is adversely affected, products formed using the precision instrument may be improperly formed and, hence, function improperly.

Many wafer tables which are used to support and to scan wafers are typically able to move in a z-direction, i.e., translate along a z-axis, and also rotate about an x-axis and about a y-axis. The ability for a wafer table to move in a z-direction, as well as to rotate about an x-axis and a y-axis, allows for focus and leveling control of the wafer table. The weight of such wafer tables, i.e., wafer tables which may translate relative to a z-axis as well as rotate relative to at least one of an x-axis and a y-axis, typically needs to be supported against the force of gravity.

In addition, a wafer table generally needs to be guided in order to control translational motion along the x-axis and the y-axis, as well as to control rotational motion about the z-axis, during focusing and leveling control. That is, while a wafer table is translating relative to the z-axis, and rotating about the x-axis or the y-axis, the wafer table typically needs to be prevented from rotating about the z-axis, and translating along the x-axis and the y-axis.

To enable a wafer table to be supported against the force of gravity and guided to reduce unwanted motion during focusing and leveling control, multiple voice coil motors (VCMs) may be used to effectively actuate the wafer table while a permanent magnet supports the weight of the wafer table. One wafer table that uses three VCMs for actuation, and has its weight supported by a permanent magnet, is described in U.S. Pat. No. 6,040,675 issued to Kazuya Ono, entitled "Supporting Apparatus Using Magnetic Power," which is incorporated herein by reference in its entirety. As described in U.S. Pat. No. 6,040,675, three VCMs are used to actuate a wafer table, while a permanent magnet is used to support the weight of the wafer table and a flexural bearing is used to guide the table.

While the use of multiple VCMs, e.g., three VCMs, a permanent magnet, and a flexural bearing is generally adequate to achieve desired results during focusing and leveling control of a wafer table, such a wafer table has a relatively high stiffness in a Z-direction. This relatively high stiffness in the Z-direction typically leads to relatively poor vibration transmissibility. Poor vibration transmissibility may compromise the integrity of a wafer that undergoes an exposure process while supported on the wafer table. Further, a flexural bearing may not be suitable for use if a wafer table is to utilize more than three degrees of freedom. For example, a six degree of freedom wafer table would not allow for the use of a flexural bearing, since a six degree of freedom wafer table may not be constrained in a direction that is typically constrained by a flexural bearing.

Therefore, what is needed is a method and an apparatus that allows a wafer table to have translational motion along a z-axis, rotational motion about an x-axis, and rotational motion about a y-axis while supported against the force of gravity and guided to reduce unwanted motion. That is, what is desired is a method and an apparatus for allowing focus and leveling control to occur while a wafer table is guided and supported against the force of gravity, without limiting the number of degrees of freedom associated with the wafer table.

SUMMARY OF THE INVENTION

The present invention relates to an actuator which is suitable for actuating a stage relative to a z-axis and supporting the weight of the stage against the force of gravity. According to one aspect of the present invention, an actuator device includes a first arrangement, a magnetic system, a piston, and a guide bearing arrangement. The first arrangement includes a yoke and a center pole, and the magnetic system includes a magnet that is coupled to the yoke as well as a coil which cooperate to function as a voice coil motor. The piston supports at least a weight associated with the first arrangement, and the guide bearing arrangement includes a planar air bearing that enables the device to move over an external surface.

In one embodiment, the device also includes a coil support that is arranged to support the coil. In such an embodiment, the guide bearing arrangement may also include a cylindrical shaft bearing that enables the center pole to translate along a z-axis and about the z-axis relative to the coil support, as well as a spherical bearing that is coupled to the center pole.

An actuator assembly which provides a force in a Z-direction while being capable of supporting weight relative to the Z-direction and providing relatively long stroke planar motion enables a stage, as for example a fine stage or a wafer table, which is actuated in the Z-direction by the actuator, allows for the stage to have up to six degrees of freedom and to have the ability to be directly driven while being able to scan in an X-direction and a Y-direction. Hence, a combination Z actuator with anti-gravity facilitates the operation of a stage with six degrees of freedom, and enables a stage to be directly driven in up to six degrees of freedom.

According to another aspect of the present invention, a stage device includes a fine stage, a guide surface or a base member, and an actuator assembly. The actuator assembly includes a voice coil motor and a guide bearing arrangement, as well as a yoke that is coupled to the fine stage. The actuator assembly also includes a piston arrangement that is arranged to substantially support a weight of the fine stage in a z-direction. The guide bearing arrangement includes a planar air bearing that enables the actuator assembly to move over the base member in an x-direction, in a y-direction, and about the z-direction. In one embodiment, the piston arrangement includes a piston and pressurized air, and the weight of the fine stage is substantially supported in the z-direction by the piston arrangement when the piston is acted upon by the pressurized air.

In accordance with another aspect of the present invention, a stage device includes a fine stage, a base member, and an actuator assembly. The actuator assembly is arranged to contact the fine stage and includes a voice coil motor, a guide bearing arrangement, and a center pole and yoke assembly. A piston arrangement, which is also included in the actuator assembly, substantially supports a weight of the fine stage in a z-direction and the guide bearing arrangement includes a planar air bearing that enables the actuator assembly to move over the base member in an x-direction, in a y-direction, and about the z-direction. In one embodiment, the actuator assembly further includes a spherical bearing that is coupled to the center pole and yoke assembly. In such an embodiment, the spherical bearing enables the center pole and yoke assembly to rotate relative to the fine stage about the x-direction and the y-direction.

These and other advantages of the present invention will become apparent upon reading the following detailed descriptions and studying the various figures of the drawings.

BRIEF DESCRIPTION OF THE DRAWINGS

The invention may best be understood by reference to the following description taken in conjunction with the accompanying drawings in which.

DETAILED DESCRIPTION OF THE EMBODIMENTS

It is generally desirable for a wafer table, or a fine stage, to be able to be moved along a z-axis, as well as about an x-axis and a y-axis for focus and leveling control purposes. In other words, in order for focus and leveling control to be achieved, a wafer table typically has the ability to translate relative to a z-axis, as well as the ability to rotate relative to an x-axis and a y-axis. Additionally, to further enable focus and leveling control to be accurately achieved, a wafer table is generally supported against the force of gravity, and guided to control motion along the x-axis, along the y-axis, and about the z-axis.

An overall device which combines a Z actuator and an anti-gravity device may be used to support a wafer table against the force of gravity, while enabling motion along an x-axis and a y-axis, as well as rotational motion about a z-axis, to be guided. Such a device, when supporting a wafer table, also allows the wafer table to be moved appropriately for focus and leveling control. In one embodiment, a wafer table supported on a combination Z actuator and anti-gravity device may move in up to six degrees of freedom, as the wafer table is guided by the combination Z actuator anti-gravity device and is not guided by a flexural bearing which would constrain some motion of the wafer table.

Figure 1A:
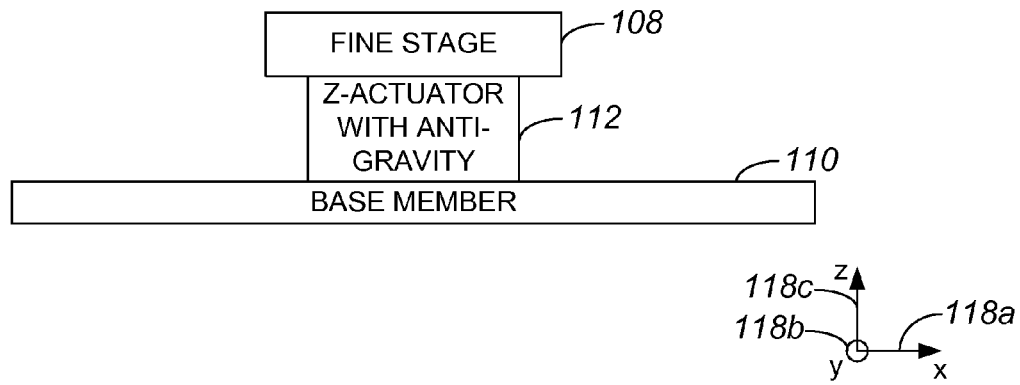
FIG. 1a is a block diagram representation of a wafer table which is coupled to a combination Z actuator and anti-gravity device in accordance with an embodiment of the present invention.

A stage apparatus may generally be arranged to include a fine stage, or a wafer table, which effectively scans directly over a surface plate or a base member. FIG. 1a is a block diagram representation of a stage apparatus which includes a combination Z actuator and anti-gravity device in accordance with an embodiment of the present invention. A stage device 100 includes a fine stage 108 which is positioned over a base member 110. As will be appreciated by those skilled in the art, base member 110 is generally a smooth surface over which a stage such as fine stage 108 scans. Base member 110 may be a surface associated with a coarse stage (not shown) positioned under fine stage 108, or base member 110 may be a surface associated with a base over which fine stage 108 scans. Fine stage 108, which is typically arranged to support an object such as a wafer, is arranged to have up to six degrees of freedom, and is capable of being guided in degrees of freedom which include planar degrees of freedom, i.e., guided along an x-axis 118a and a y-axis 118b.

Figure 1B:
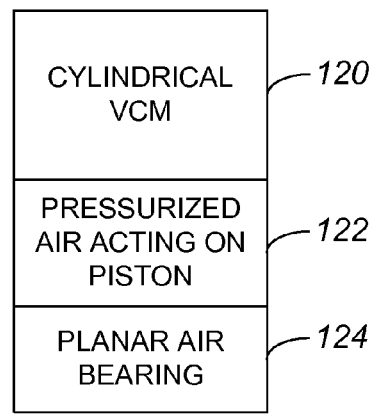
FIG. 1b is a block diagram representation of a combination Z actuator and anti-gravity device, i.e., device 112 of FIG. 1a, in accordance with an embodiment of the present invention.

To enable fine stage 108 to be guided in planar degrees of freedom, as for example for overlay control, over base member 110, an actuator 112 which includes an actuator portion that actuates fine stage 108 along a z-axis 118c, an anti-gravity device portion, and a planar air bearing is used to support fine stage 108. In general, actuator 112 is effectively a cylinder which contains an actuator portion, an anti-gravity device portion, and a planar air bearing. As shown in FIG. 1b, which is a block diagram representation of actuator 112, actuator 112 includes a cylindrical voice coil motor (VCM) 120. VCM 120 is arranged to provide a force which actuates fine stage 108 of FIG. 1a in a Z-direction. Actuator 112 provides anti-gravity capabilities that enable the weight of fine stage 108 of FIG. 1a to be supported through a mechanism 122 which includes, in the described embodiment, pressurized air that acts on a piston. A planar air bearing 124 is effectively an air bearing surface which is essentially parallel to a surface of base member 110 of FIG. 1a, and enables actuator 112 to move over base member 110 or, more generally, an underlying surface translationally relative to x-axis 118a, translationally relative to y-axis 118b, and rotationally relative to z-axis 118c. Planar air bearing 124 may be one of a plurality of air bearings associated with an overall guide bearing arrangement (not shown) associated with actuator 112. Typically, planar air bearing 124 allows actuator 112 to undergo long stroke motion along x-axis 118a and y-axis 118b with respect to base member 110, or a guide surface. In one embodiment, when fine stage 108 of FIG. 1a is arranged to be directly driven by actuator 112, the ability for actuator 112 to support long stroke planar motion along base member 110 facilitates the use of other actuators (not shown) to directly drive fine stage 108 along x-axis 118a and y-axis 118b.

Figure 2A:
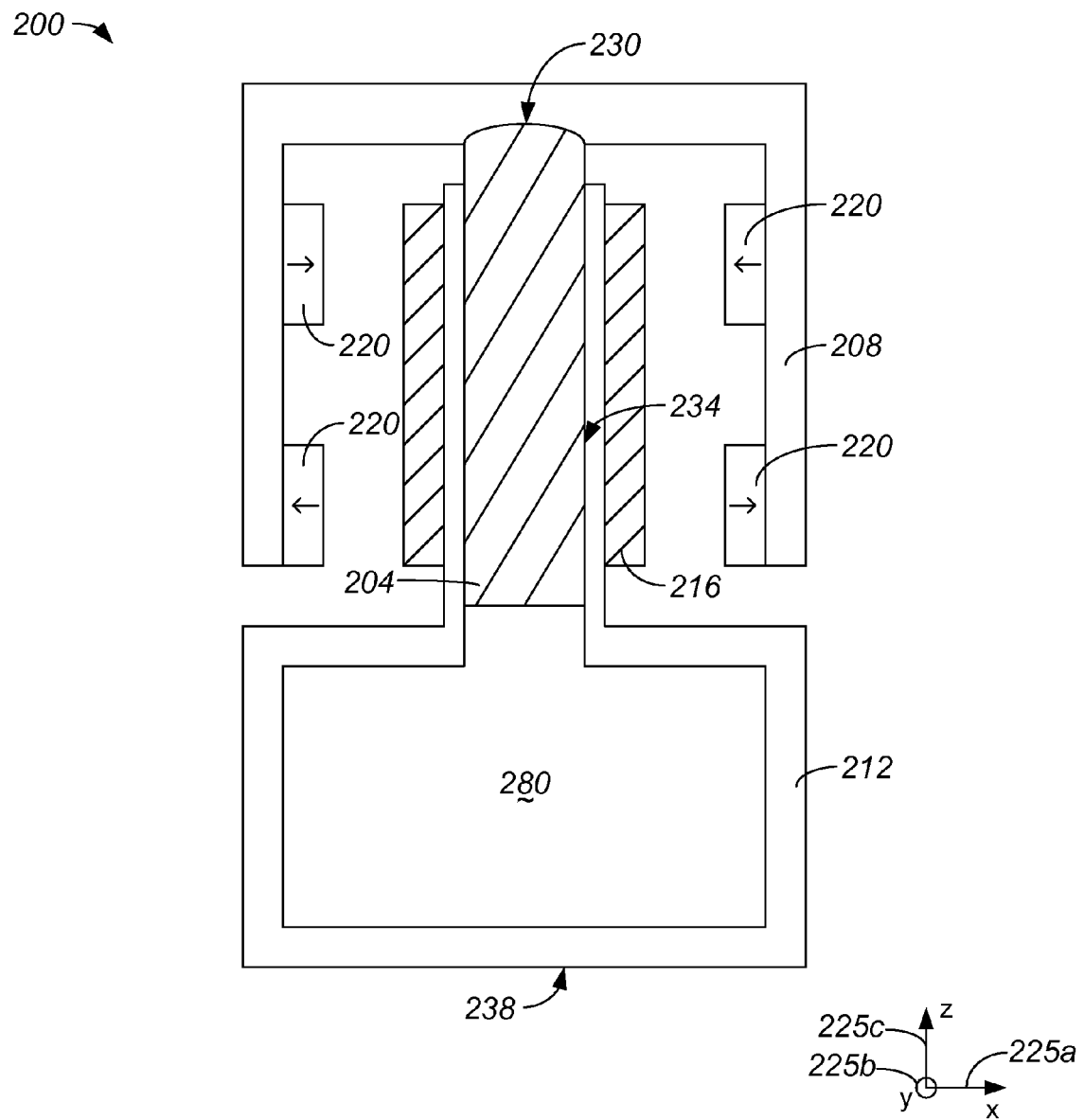
FIG. 2a is a diagrammatic cross-sectional representation of a first actuator which provides a force in a Z-direction and anti-gravity capabilities in accordance with an embodiment of the present invention.

With reference to FIG. 2a, one embodiment of an actuator assembly which provides a force in a Z-direction and anti-gravity capabilities will be described in accordance with the present invention. An actuator assembly 200 includes a center pole 204, a coil support 212, and a coil 216 that is supported by coil support 212. Typically, coil 216 is rigidly attached to coil support 212. Magnets 220 are mounted on a yoke 208, and are arranged to cooperate with coil 216 such that when a current is provided to coil 216, a force is generated in a Z-direction, i.e., force is generated along a z-axis 225c. As will be appreciated by those skilled in the art, center pole 204, coil support 212, and coil 216, in addition to magnets 220, are all typically components of a cylindrical VCM.

A bearing 230, which is located at an interface between yoke 208 and center pole 204, enables yoke 208 to rotate relative to center pole 204 about an x-axis 225a and a y-axis 225b. Bearing 230, which may be a spherical bearing, effectively enables yoke 208 to rotate relative to center pole 204 while center pole 204 is generally fixed to yoke 208 along x-axis 225ay-axis 225band z-axis 225c. That is, center pole 204 is substantially fixed to yoke 208 such that yoke 208 may not translate significantly relative to center pole 204 along x-axis 225ay-axis 225band z-axis 225calthough bearing 230 enables yoke 208 to rotate relative to center pole 204 about x-axis 225a and y-axis 225b. In one embodiment, bearing 230 may be subject to a magnetic preload, e.g., bearing 230 may be a magnetically preloaded spherical bearing.

Between coil support 212 and center pole 204, a bearing 234 is positioned to enable center pole 204 to slide relative to coil support 212 along z-axis 225c. Bearing 234 is a cylindrical shaft bearing in one embodiment, and allows center pole 204 to rotate about z-axis 225c relative to coil support 212, in addition to allowing center pole 204 to translate along z-axis 225c relative to coil support 212. To support the weight of center pole 204 and yoke 208 against the forces of gravity, air is arranged in a chamber 280. It should be appreciated that pressurized air which acts on a piston (not shown) enables the weight of center pole 204 and yoke 208 to be supported relative to z-axis 225cas will be discussed below. The air in chamber 280 serves as an anti-gravity device which supports center pole 204 and yoke 208 relative to a Z-direction.

A bearing surface 238, which is associated with a planar air bearing, is arranged to guide actuator assembly 200 along a surface on which bearing surface 238 effectively slides. Specifically, bearing surface 238 enables actuator assembly 200 to slide over a surface, e.g., a surface of a base member (not shown), along x-axis 225a, along y-axis 225b, and about z-axis 225c. It should be appreciated that actuator assembly 200 may effectively be indirectly actuated to move along x-axis 225a, along y-axis 225b, and about z-axis 225c through the use of other actuators. Bearing surface 238, bearing 234, and bearing 230 may be considered to be stacked air bearings which form a guide bearing arrangement.

Figure 2B:
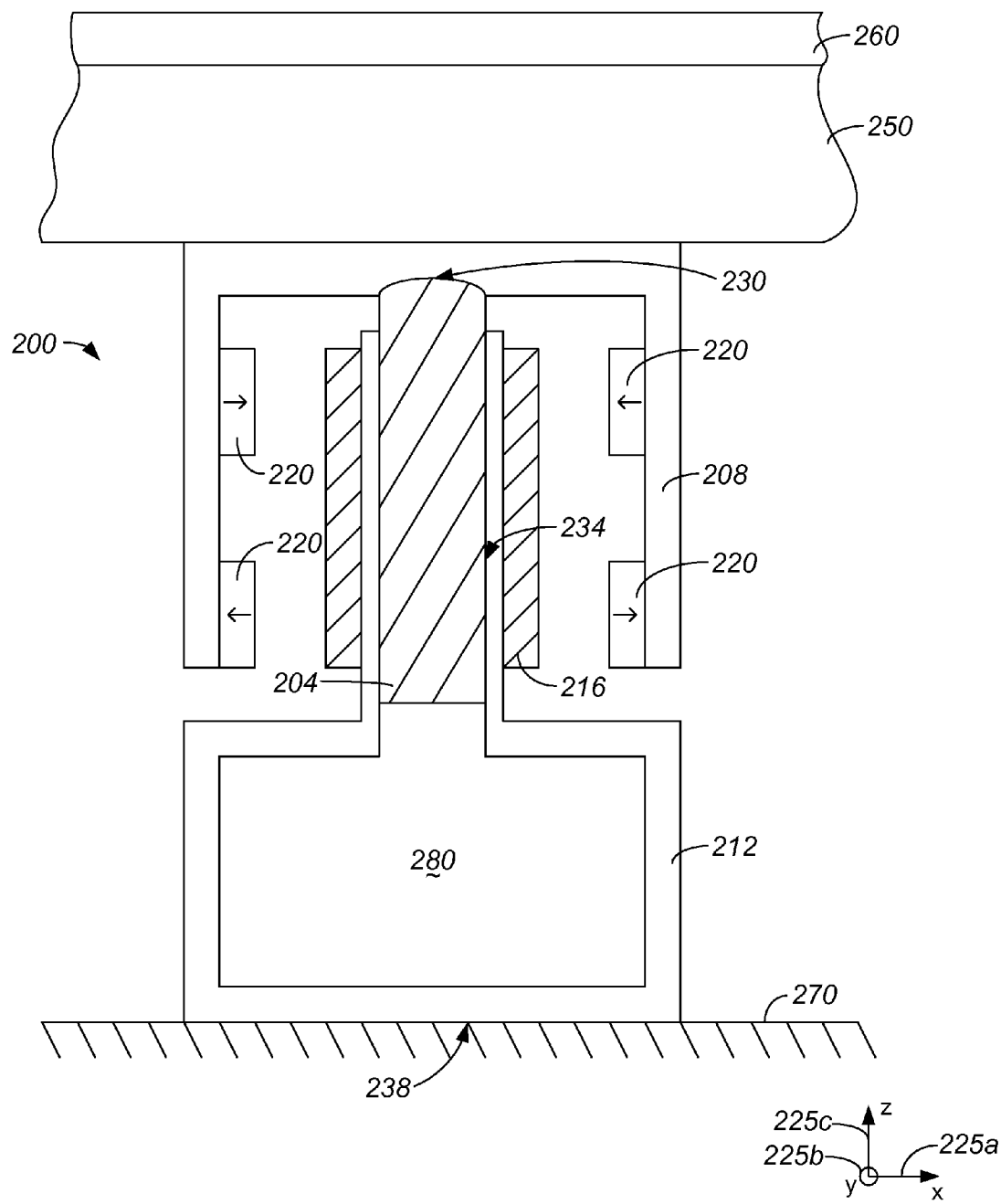
FIG. 2b is a diagrammatic cross-sectional side view representation of an actuator assembly, i.e., actuator assembly 200 of FIG. 2a, within a stage apparatus in accordance with an embodiment of the present invention.

FIG. 2b is a diagrammatic cross-sectional side view representation of an actuator assembly, i.e., actuator assembly 200 of FIG. 2a, within a stage apparatus in accordance with an embodiment of the present invention. When actuator assembly 200 is within a stage apparatus, as for example a stage apparatus which includes a direct drive wafer stage, actuator assembly 200 may be used to drive the wafer stage in a Z-direction. A direct drive wafer stage generally is a wafer stage in which six degrees of freedom are controlled by up to approximately six actuators. That is, a direct drive wafer stage is a wafer stage which has up to six degrees of freedom that may be substantially directly driven by actuators, one of which may be actuator assembly 200. Bearing surface 238 is arranged to enable actuator assembly 200 to move relative to a surface of a base member 270, or substantially any planar, smooth surface associated with a stage apparatus. Typically, as previously mentioned, bearing surface 238 allows for substantially guided movement along x-axis 225a, along y-axis 225b, and about z-axis 225c. Coil support 212 effectively slides over base member 270 through the use of bearing surface 238.

Yoke 208 is arranged to be coupled to a fine stage 250, or a wafer table, which supports an object 260, e.g., a wafer. In one embodiment, yoke 208 is arranged to be rigidly connected to fine stage 250 such that bearing 230 allows fine stage 250 and center pole 204 to effectively rotate relative to each other about x-axis 225a and y-axis 225b. Further, when yoke 208 is substantially rigidly connected to fine stage 250, when bearing 234 enables center pole 204 to slide relative to coil support 212 along z-axis 225c, fine stage 250 is actuated in a direction along z-axis 225c. The weight of yoke 208, center pole 204, fine stage 250, and object 260 are generally substantially supported against the force of gravity by air, as for example pressurized air, in chamber 280. That is, air in chamber 280 serves as an anti-gravity device that supports the weight of fine stage 250 and object 260, while providing a relatively low stiffness, as for example during focus and leveling control.

Figure 3A:
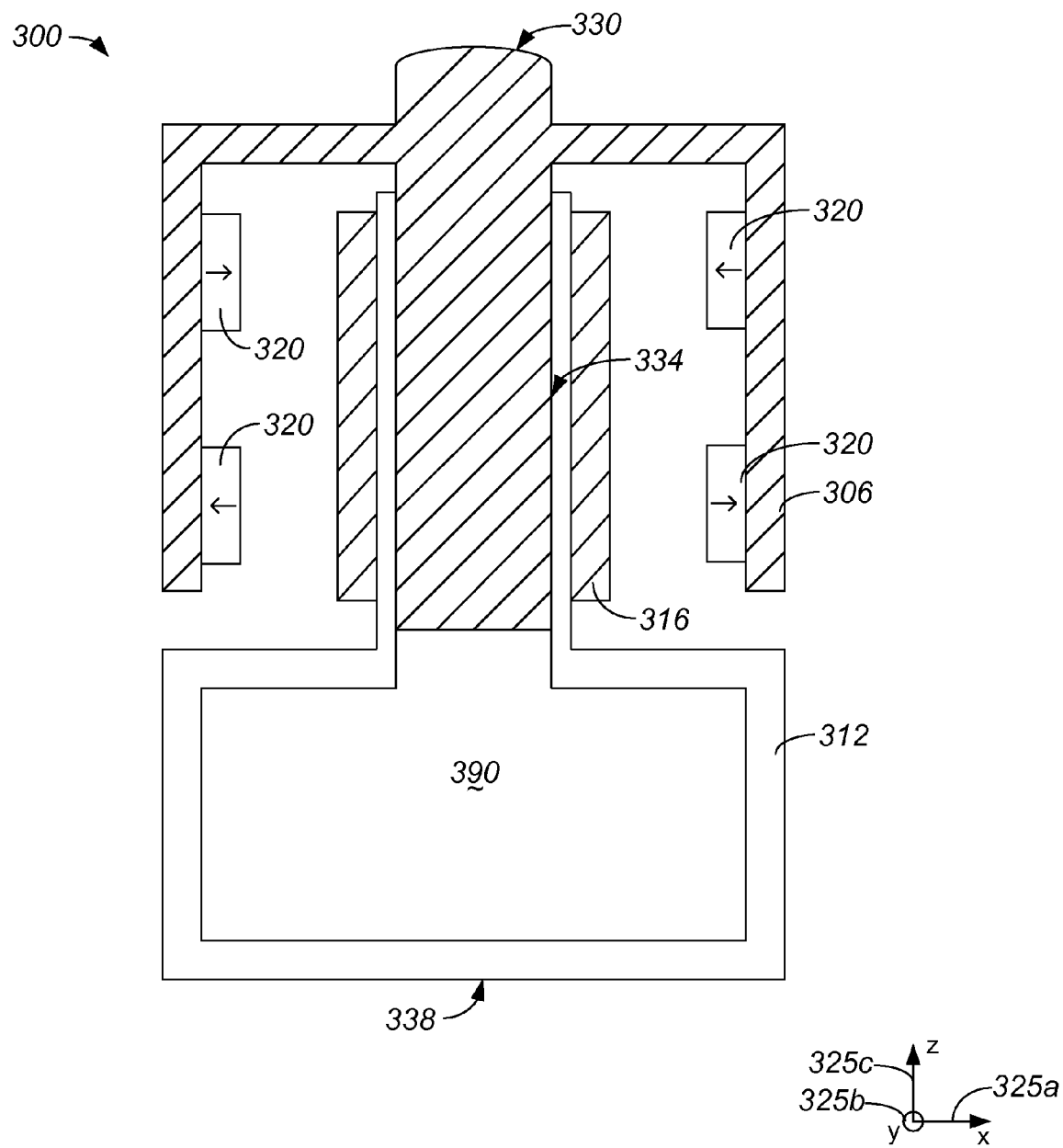
FIG. 3a is a diagrammatic cross-sectional representation of a second actuator which provides a force in a Z-direction and anti-gravity capabilities in accordance with an embodiment of the present invention.

While yoke 208 and center pole 204 may be substantially separate components within actuator 200, it should be appreciated that in one embodiment, yoke 208 and center pole 204 may be formed as a substantially integral single component. With reference to FIG. 3a, one embodiment of an actuator assembly which provides a force in a Z-direction and anti-gravity capabilities, and includes an integrated yoke and center pole will be described in accordance with the present invention. An actuator assembly 300 includes a center pole and yoke component 306 on which magnets 320 may be substantially fixed. A coil 316 is coupled, e.g., rigidly attached, to a coil support 312. A bearing 334, which may be a cylindrical shaft bearing, is arranged to enable coil support 312 to slide relative to center pole and yoke component 306 along a z-axis 325c, and to rotate relative to center pole and yoke component 306 about z-axis 325c. Air, e.g., pressurized air, in a chamber 390 is arranged to cooperate with a piston (not shown) to support center pole and yoke component 306, or at least a VCM portion of actuator assembly 300, against the force of gravity.

Figure 3B:
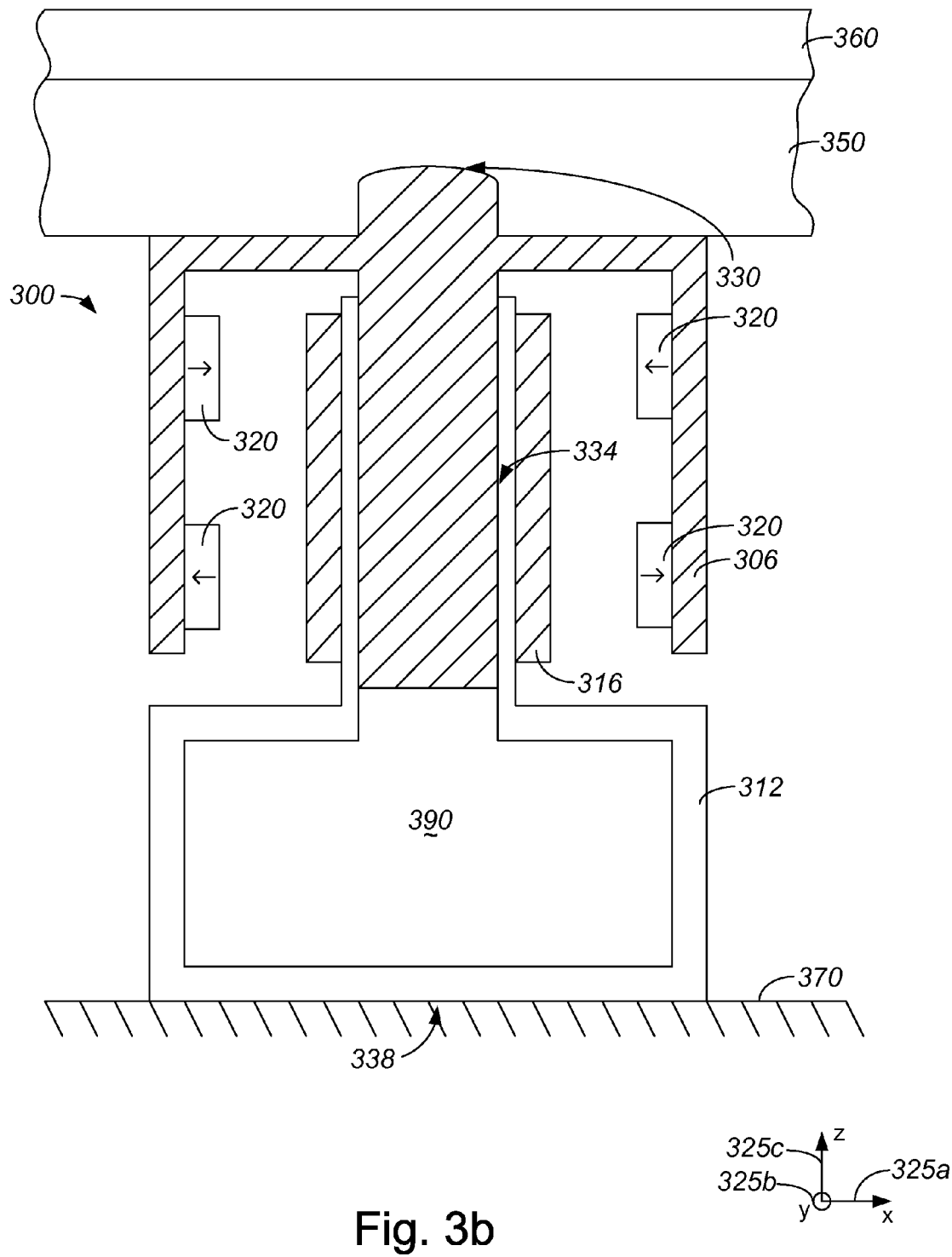
FIG. 3b is a diagrammatic cross-sectional side view representation of an actuator assembly, i.e., actuator assembly 300 of FIG. 3a, that supports a fine stage within a stage apparatus in accordance with an embodiment of the present invention.

A bearing 330, which may be a spherical air bearing, is arranged to allow center pole and yoke component 306 to rotate about an x-axis 325a and a y-axis 325b relative to a component (not shown) which may effectively be supported by actuator assembly 300, as will be discussed below with respect to FIG. 3b. A bearing surface 338, which is generally associated with a planar air bearing, is arranged to enable actuator 300 to scan over a surface, as for example the surface of a base member 370 of FIG. 3b, along x-axis 325a and y-axis 325b, and about z-axis 325c.

Substantially all of actuator assembly 300 may rotate relative to a wafer table or other device supported and actuated by actuator assembly 300. FIG. 3b is a diagrammatic cross-sectional side view representation of an actuator assembly, i.e., actuator assembly 300 of FIG. 3a, that supports a fine stage within a stage apparatus in accordance with an embodiment of the present invention. Actuator assembly 300 is arranged such that bearing 330, which is coupled to center pole and yoke component 306, contacts a fine stage 350 or wafer table. Fine stage 350, which supports an object 360 such as a wafer, is supported on actuator assembly 300. Bearing 330 enables actuator assembly 300 to rotate relative to fine stage 350 about x-axis 325a and y-axis 325b.

Bearing surface 338 is arranged to scan over a base member 370 or other guide surface along x-axis 325a and along y-axis 325b, as well as about z-axis 325c. That is, bearing surface 338 enables actuator assembly 300 to be guided to control motion along x-axis 325a, along y-axis 325b, and about z-axis 325c. Center pole and yoke component 306, in addition to magnets 320 which are coupled to center pole and yoke component 306, are arranged to move relative to coil 316 and coil support 312 in a Z direction, i.e., along z-axis 325c. As fine stage 350 is supported on bearing 330 and, hence, center pole and yoke component 306, fine stage 350 may be actuated in a Z direction by actuator 300, which also serves as an anti-gravity device using air in chamber 390.

Figure 3C:
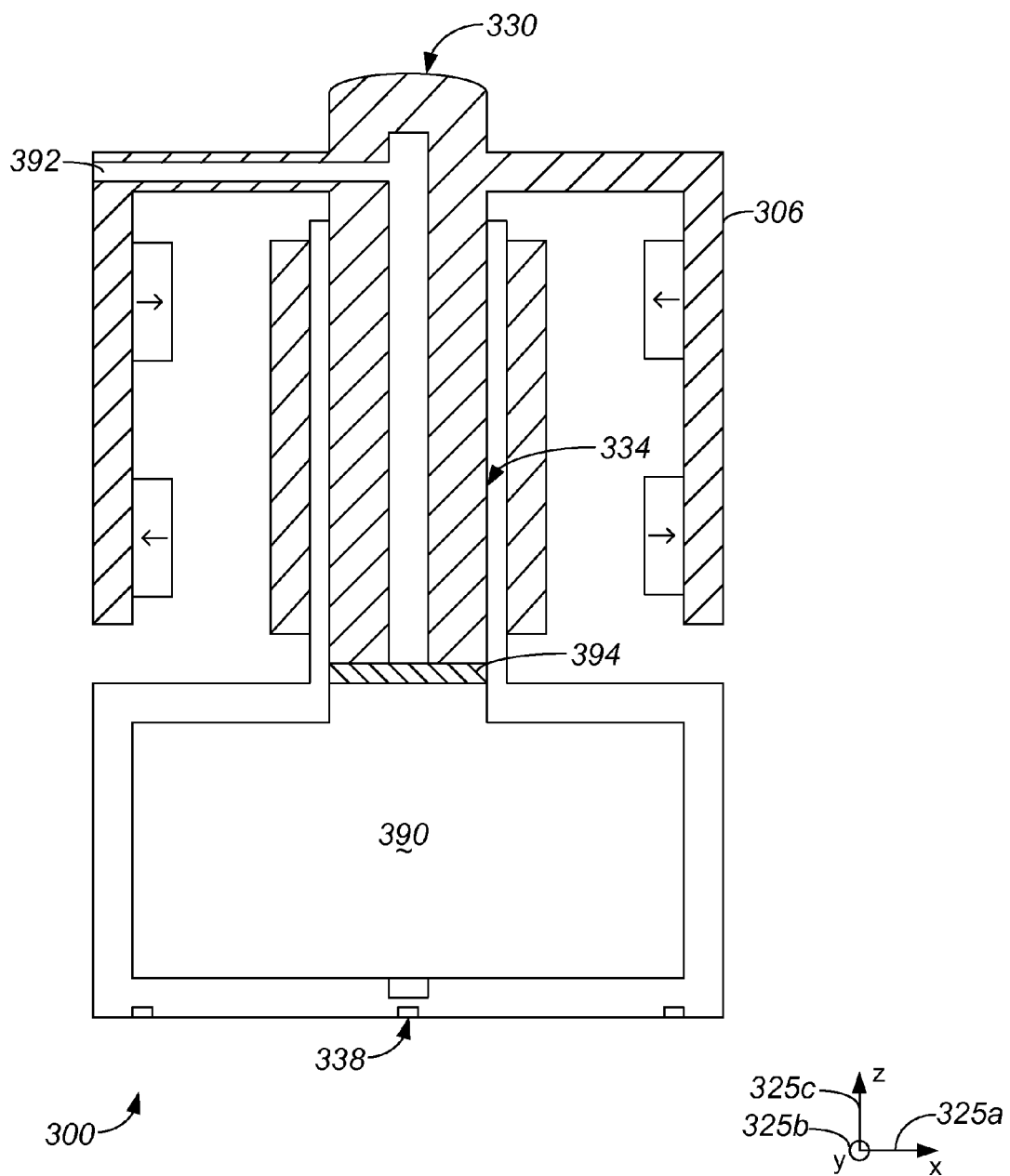
FIG. 3c is a cross-sectional side view representation of an anti-gravity system within an actuator assembly, e.g., actuator assembly 300 of FIGS. 3a and 3b, in accordance with an embodiment of the present invention.

As previously mentioned, air in chamber 390 has a pressure that may be altered, and allows the weight associated with center pole and yoke component 306, or substantially any center pole and yoke, and the weight associated with fine stage 350, to be supported against the forces of gravity. Referring next to FIG. 3c, an anti-gravity system within an actuator will be described. FIG. 3c is a cross-sectional side view representation of an anti-gravity system within an actuator assembly, e.g., actuator assembly 300 of FIGS. 3a and 3b, in accordance with an embodiment of the present invention. Within actuator assembly 300, pressurized air may be present in chamber 390. A piston 394, on which pressurized air in chamber 390 acts, is arranged to contact center pole and yoke component 306 to effectively lift center pole and yoke component 306 relative to z-axis 325c as much as needed to support the weight of center pole and yoke component 306. In general, pressurized air in chamber 390 acting on piston 394 allows a fine stage supported by actuator 300 to be supported in a Z-direction.

The pressure of air in chamber 390 may be varied by air provided through an air inlet 392 that is present within center pole and yoke component 306. Air inlet 390, in addition to supplying air to chamber 390, may also supply air to any or all of bearings 330, 334, 338. It should be appreciated that air inlet 392 may not necessarily be positioned near a top of actuator assembly 300, as shown.

Figure 4:
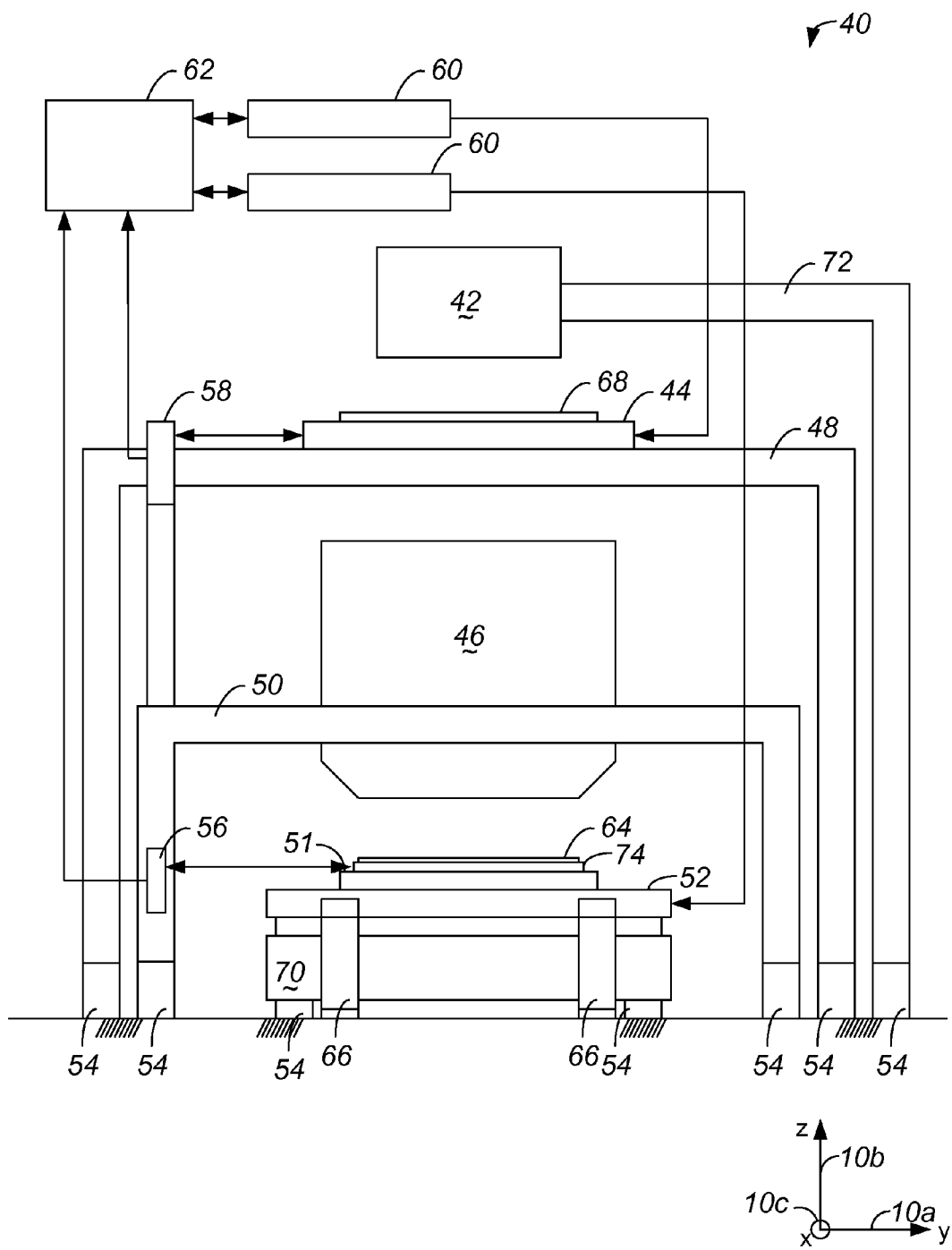
FIG. 4 is a diagrammatic representation of a photolithography apparatus in accordance with an embodiment of the present invention.

With reference to FIG. 4, a photolithography apparatus which may utilize a combination Z-actuator and anti-gravity device, e.g., to drive a wafer table or a fine wafer stage, will be described in accordance with an embodiment of the present invention. A photolithography apparatus (exposure apparatus) 40 includes a wafer table 51 or a fine stage that is, in one embodiment, a direct drive wafer table which includes up to approximately six actuators to control its position in up to six degrees of freedom. The actuators may include a combination Z-actuator and anti-gravity device. Wafer table 51 may be situated over a base member which, in one embodiment, may be a surface associated with a wafer positioning stage 52. A planar motor which drives wafer positioning stage 52 generally uses an electromagnetic force generated by magnets and corresponding armature coils arranged in two dimensions. A wafer 64 is held in place on a wafer holder or chuck 74 which is coupled to wafer table 51. Wafer positioning coarse stage 52 is arranged to move in multiple degrees of freedom, e.g., between three to six degrees of freedom, under the control of a control unit 60 and a system controller 62. The movement of wafer positioning coarse stage 52, as well as the precise control of wafer table 51, allows wafer 64 to be positioned at a desired position and orientation relative to a projection optical system 46.

Wafer table 51 may be a fine stage, as previously mentioned. Wafer table 51 may be supported in z-direction 10b by a combination Z-actuator and anti-gravity device and is driven relative to z-direction 10b using a VCM included in the combination Z-actuator and anti-gravity device. The motor array of wafer positioning coarse stage 52 is typically supported by a base 70. Base 70 is supported to a ground via isolators 54. Reaction forces generated by motion of wafer stage 52 may be mechanically released to a ground surface through a frame 66. One suitable frame 66 is described in JP Hei 8-166475 and U.S. Pat. No. 5,528,118, which are each herein incorporated by reference in their entireties.

An illumination system 42 is supported by a frame 72. Frame 72 is supported to the ground via isolators 54. Illumination system 42 includes an illumination source, and is arranged to project a radiant energy, e.g., light, through a mask pattern on a reticle 68 that is supported by and scanned using a reticle stage which includes a coarse stage and a fine stage. The radiant energy is focused through projection optical system 46, which is supported on a projection optics frame 50 and may be supported the ground through isolators 54. Suitable isolators 54 include those described in JP Hei 8-330224 and U.S. Pat. No. 5,874,820, which are each incorporated herein by reference in their entireties.

A first interferometer 56 is supported on projection optics frame 50, and functions to detect the position of wafer table 51. Interferometer 56 outputs information on the position of wafer table 51 to system controller 62. In one embodiment, wafer table 51 has a force damper which reduces vibrations associated with wafer table 51 such that interferometer 56 may accurately detect the position of wafer table 51. A second interferometer 58 is supported on projection optical frame 50, and detects the position of reticle stage 44 which supports a reticle 68. Interferometer 58 also outputs position information to system controller 62.

It should be appreciated that there are a number of different types of photolithographic apparatuses or devices. For example, photolithography apparatus 40, or an exposure apparatus, may be used as a scanning type photolithography system which exposes the pattern from reticle 68 onto wafer 64 with reticle 68 and wafer 64 moving substantially synchronously. In a scanning type lithographic device, reticle 68 is moved perpendicularly with respect to an optical axis of a lens assembly (projection optical system 46) or illumination system 42 by reticle stage 44. Wafer 64 is moved perpendicularly to the optical axis of projection optical system 46 by a wafer table 51. Scanning of reticle 68 and wafer 64 generally occurs while reticle 68 and wafer 64 are moving substantially synchronously.

Alternatively, photolithography apparatus or exposure apparatus 40 may be a step-and-repeat type photolithography system that exposes reticle 68 while reticle 68 and wafer 64 are stationary, i.e., at a substantially constant velocity of approximately zero meters per second. In one step and repeat process, wafer 64 is in a substantially constant position relative to reticle 68 and projection optical system 46 during the exposure of an individual field. Subsequently, between consecutive exposure steps, wafer 64 is consecutively moved by wafer positioning stage 52 perpendicularly to the optical axis of projection optical system 46 and reticle 68 for exposure. Following this process, the images on reticle 68 may be sequentially exposed onto the fields of wafer 64 so that the next field of semiconductor wafer 64 is brought into position relative to illumination system 42, reticle 68, and projection optical system 46.

It should be understood that the use of photolithography apparatus or exposure apparatus 40, as described above, is not limited to being used in a photolithography system for semiconductor manufacturing. For example, photolithography apparatus 40 may be used as a part of a liquid crystal display (LCD) photolithography system that exposes an LCD device pattern onto a rectangular glass plate or a photolithography system for manufacturing a thin film magnetic head.

The illumination source of illumination system 42 may be g-line (436 nanometers (nm)), i-line (365 nm), a KrF excimer laser (248 nm), an ArF excimer laser (193 nm), and an $F_2$-type laser (157 nm). Alternatively, illumination system 42 may also use charged particle beams such as x-ray and electron beams. For instance, in the case where an electron beam is used, thermionic emission type lanthanum hexaboride ($LaB_6$) or tantalum (Ta) may be used as an electron gun. Furthermore, in the case where an electron beam is used, the structure may be such that either a mask is used or a pattern may be directly formed on a substrate without the use of a mask.

With respect to projection optical system 46, when far ultra-violet rays such as an excimer laser is used, glass materials such as quartz and fluorite that transmit far ultra-violet rays is preferably used. When either an $F_2$-type laser or an x-ray is used, projection optical system 46 may be either catadioptric or refractive (a reticle may be of a corresponding reflective type), and when an electron beam is used, electron optics may comprise electron lenses and deflectors. As will be appreciated by those skilled in the art, the optical path for the electron beams is generally in a vacuum.

In addition, with an exposure device that employs vacuum ultra-violet (VUV) radiation of a wavelength that is approximately 200 nm or lower, use of a catadioptric type optical system may be considered. Examples of a catadioptric type of optical system include, but are not limited to, those described in Japan Patent Application Disclosure No. 8-171054 published in the Official gazette for Laid-Open Patent Applications and its counterpart U.S. Pat. No. 5,668,672, as well as in Japan Patent Application Disclosure No. 10-20195 and its counterpart U.S. Pat. No. 5,835,275, which are all incorporated herein by reference in their entireties. In these examples, the reflecting optical device may be a catadioptric optical system incorporating a beam splitter and a concave mirror. Japan Patent Application Disclosure (Hei) No. 8-334695 published in the Official gazette for Laid-Open Patent Applications and its counterpart U.S. Pat. No. 5,689,377, as well as Japan Patent Application Disclosure No. 10-3039 and its counterpart U.S. Pat. No. 5,892,117, which are all incorporated herein by reference in their entireties. These examples describe a reflecting-refracting type of optical system that incorporates a concave mirror, but without a beam splitter, and may also be suitable for use with the present invention.

Further, in photolithography systems, when linear motors (see U.S. Pat. Nos. 5,623,853 or 5,528,118, which are each incorporated herein by reference in their entireties) are used in a wafer stage or a reticle stage, the linear motors may be either an air levitation type that employs air bearings or a magnetic levitation type that uses Lorentz forces or reactance forces. Additionally, the stage may also move along a guide, or may be a guideless type stage which uses no guide.

Alternatively, a wafer stage or a reticle stage may be driven by a planar motor which drives a stage through the use of electromagnetic forces generated by a magnet unit that has magnets arranged in two dimensions and an armature coil unit that has coil in facing positions in two dimensions. With this type of drive system, one of the magnet unit or the armature coil unit is connected to the stage, while the other is mounted on the moving plane side of the stage. Movement of the stages as described above generates reaction forces which may affect performance of an overall photolithography system. Reaction forces generated by the wafer (substrate) stage motion may be mechanically released to the floor or ground by use of a frame member as described above, as well as in U.S. Pat. No. 5,528,118 and published Japanese Patent Application Disclosure No. 8-166475. Additionally, reaction forces generated by the reticle (mask) stage motion may be mechanically released to the floor (ground) by use of a frame member as described in U.S. Pat. No. 5,874,820 and published Japanese Patent Application Disclosure No. 8-330224, which are each incorporated herein by reference in their entireties.

Isolaters such as isolators 54 may generally be associated with an active vibration isolation system (AVIS). An AVIS generally controls vibrations associated with forces 112, i.e., vibrational forces, which are experienced by a stage assembly or, more generally, by a photolithography machine such as photolithography apparatus 40 which includes a stage assembly.

The present invention may be utilized in an exposure apparatus that is operated in a vacuum environment or circumstance such as an EB type exposure apparatus or an EUVL type exposure apparatus by incorporating suitable measures to accommodate the vacuum circumstances for the air, or fluid, bearing arrangement as described above. The present invention may also be utilized in an immersion type exposure apparatus by incorporating suitable measures to accommodate a liquid. For example, PCT Patent Application WO 99/49504 discloses an exposure apparatus in which a liquid is supplied to a space between a substrate such as a wafer and a projection lens system in an exposure process. As far as is permitted, the disclosures in PCT Patent Application WO 99/49504 is incorporated herein by reference.

Further, the present invention may be utilized in an exposure apparatus that comprises two or more substrate and/or reticle stages. In such apparatuses, the additional stage may be used in parallel or preparatory steps while the other stage is being utilized for an exposure process. Multiple stage exposure apparatuses are described, for example, in Japan Patent Application Disclosure No. 10-163099 and in Japan Patent Application Disclosure No. 10-214783, as well as in their counterpart U.S. patents which include U.S. Pat. Nos. 6,341,007, 6,400,441, 6,549,269, and U.S. Pat. No. 6,590,634. In addition, a multiple stage exposure apparatus is described in Japan Patent Application Disclosure No. 2000-505958 and its counterparts U.S. Pat. No. 5,969,441 and U.S. Pat. No. 6,208,407. As far as is permitted, each of the disclosures in the above-mentioned U.S. patent and Japan Patent Application Disclosures are incorporated herein by reference.

The present invention may also be utilized in an exposure apparatus that has a movable stage which retains a substrate such as a wafer for exposure, and a stage having various sensors or measurement tools for measuring, as described in Japan Patent Application Disclosure No. 11-135400. As far as is permitted, the disclosure in the above-mentioned Japan Patent Application Disclosure is incorporated herein by reference.

A photolithography system according to the above-described embodiments, e.g., a photolithography apparatus which may include one or more dual force actuators, may be built by assembling various subsystems in such a manner that prescribed mechanical accuracy, electrical accuracy, and optical accuracy are maintained. In order to maintain the various accuracies, prior to and following assembly, substantially every optical system may be adjusted to achieve its optical accuracy. Similarly, substantially every mechanical system and substantially every electrical system may be adjusted to achieve their respective desired mechanical and electrical accuracies. The process of assembling each subsystem into a photolithography system includes, but is not limited to, developing mechanical interfaces, electrical circuit wiring connections, and air pressure plumbing connections between each subsystem. There is also a process where each subsystem is assembled prior to assembling a photolithography system from the various subsystems. Once a photolithography system is assembled using the various subsystems, an overall adjustment is generally performed to ensure that substantially every desired accuracy is maintained within the overall photolithography system. Additionally, it may be desirable to manufacture an exposure system in a clean room where the temperature and humidity are controlled.

Figure 5:
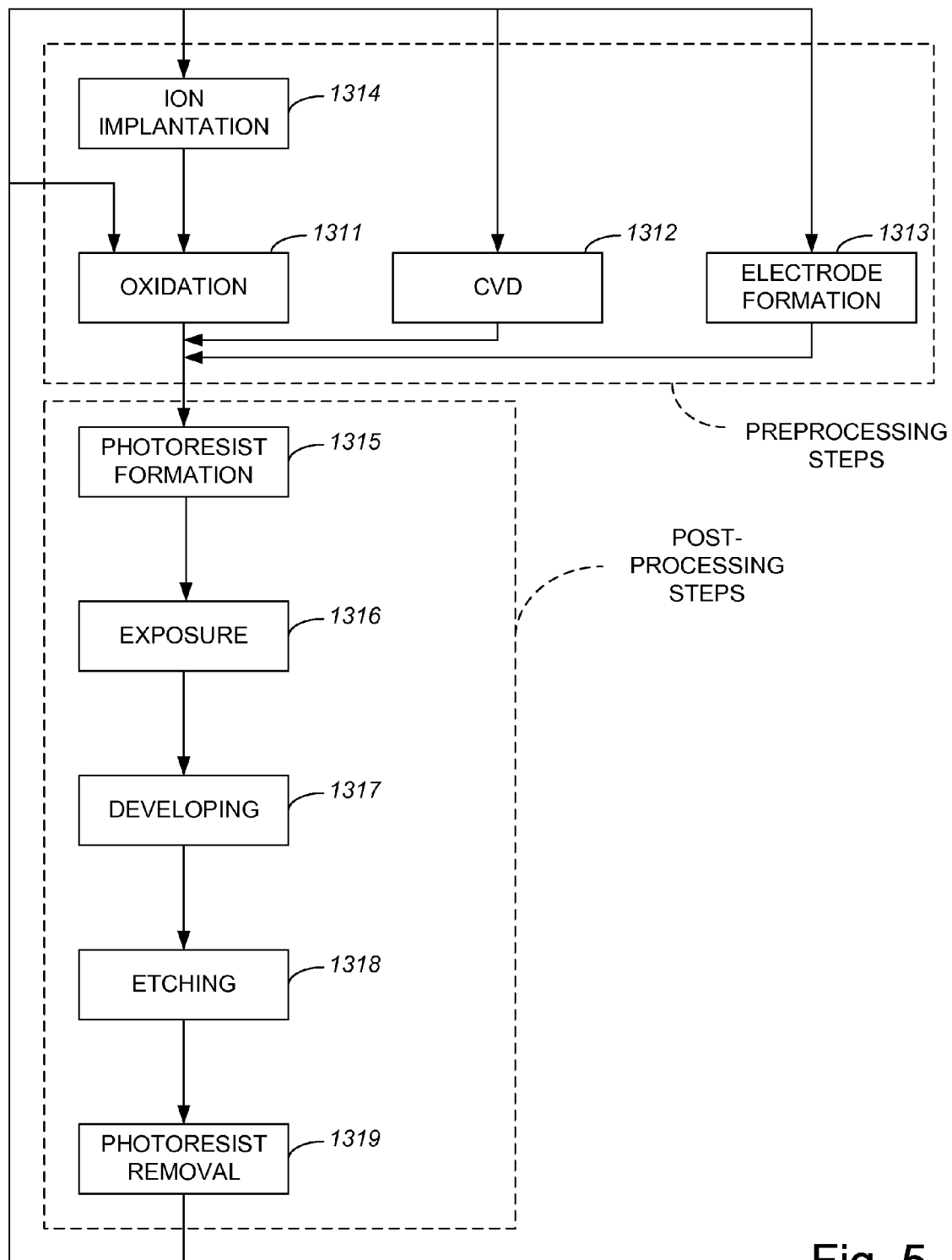
FIG. 5 is a process flow diagram which illustrates the steps associated with fabricating a semiconductor device in accordance with an embodiment of the present invention.

Further, semiconductor devices may be fabricated using systems described above, as will be discussed with reference to FIG. 5. The process begins at step 1301 in which the function and performance characteristics of a semiconductor device are designed or otherwise determined. Next, in step 1302, a reticle (mask) in which has a pattern is designed based upon the design of the semiconductor device. It should be appreciated that in a parallel step 1303, a wafer is made from a silicon material. The mask pattern designed in step 1302 is exposed onto the wafer fabricated in step 1303 in step 1304 by a photolithography system. One process of exposing a mask pattern onto a wafer will be described below with respect to FIG. 6. In step 1305, the semiconductor device is assembled. The assembly of the semiconductor device generally includes, but is not limited to, wafer dicing processes, bonding processes, and packaging processes. Finally, the completed device is inspected in step 1306.

Figure 6:
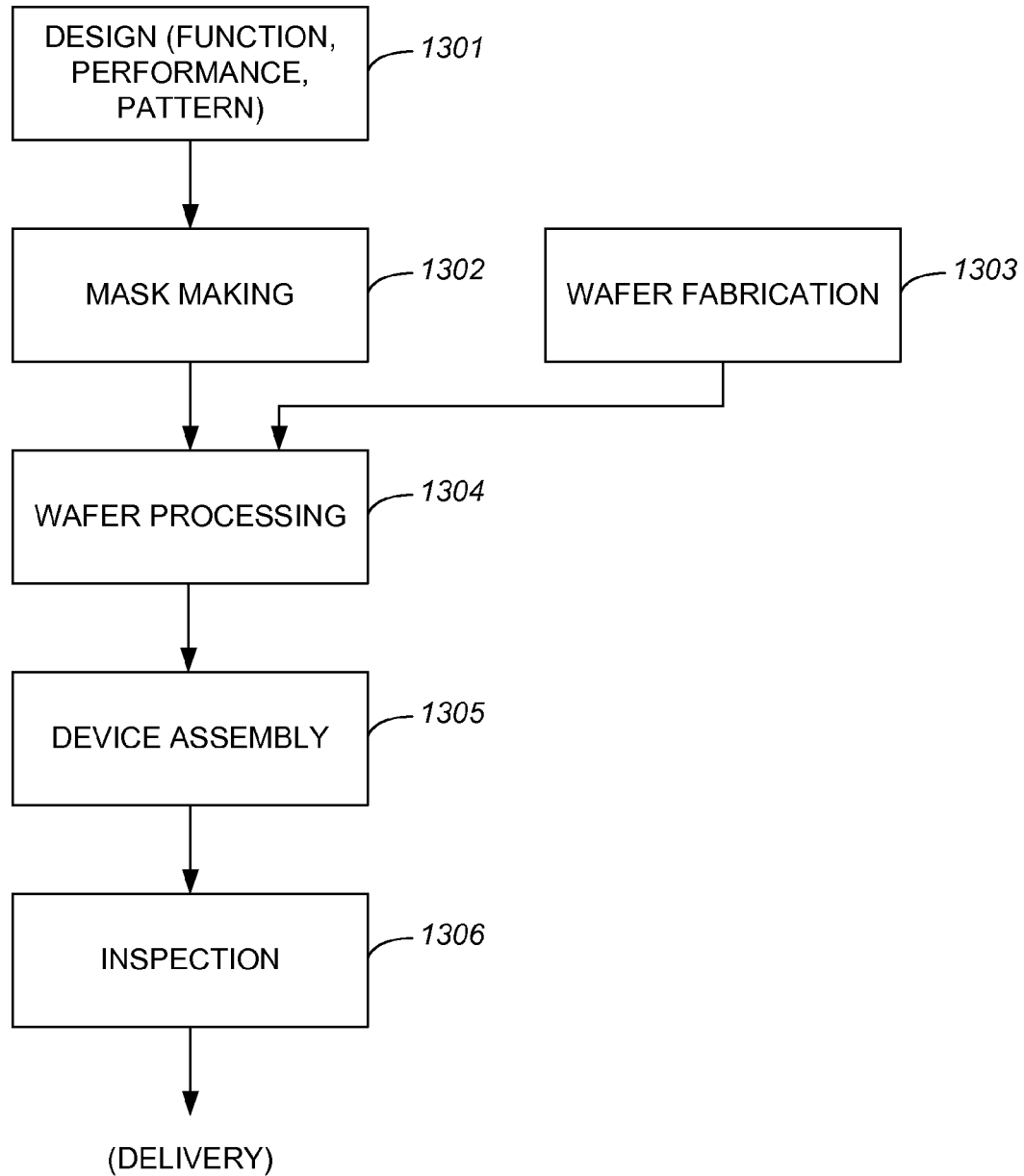
FIG. 6 is a process flow diagram which illustrates the steps associated with processing a wafer, i.e., step 1304 of FIG. 5, in accordance with an embodiment of the present invention.

FIG. 6 is a process flow diagram which illustrates the steps associated with wafer processing in the case of fabricating semiconductor devices in accordance with an embodiment of the present invention. In step 1311, the surface of a wafer is oxidized. Then, in step 1312 which is a chemical vapor deposition (CVD) step, an insulation film may be formed on the wafer surface. Once the insulation film is formed, in step 1313, electrodes are formed on the wafer by vapor deposition. Then, ions may be implanted in the wafer using substantially any suitable method in step 1314. As will be appreciated by those skilled in the art, steps 1311-1314 are generally considered to be preprocessing steps for wafers during wafer processing. Further, it should be understood that selections made in each step, e.g., the concentration of various chemicals to use in forming an insulation film in step 1312, may be made based upon processing requirements.

At each stage of wafer processing, when preprocessing steps have been completed, post-processing steps may be implemented. During post-processing, initially, in step 1315, photoresist is applied to a wafer. Then, in step 1316, an exposure device may be used to transfer the circuit pattern of a reticle to a wafer. Transferring the circuit pattern of the reticle of the wafer generally includes scanning a reticle scanning stage which may, in one embodiment, include a force damper to dampen vibrations.

After the circuit pattern on a reticle is transferred to a wafer, the exposed wafer is developed in step 1317. Once the exposed wafer is developed, parts other than residual photoresist, e.g., the exposed material surface, may be removed by etching. Finally, in step 1319, any unnecessary photoresist that remains after etching may be removed. As will be appreciated by those skilled in the art, multiple circuit patterns may be formed through the repetition of the preprocessing and post-processing steps.

Although only a few embodiments of the present invention have been described, it should be understood that the present invention may be embodied in many other specific forms without departing from the spirit or the scope of the present invention. By way of example, although a combination Z-actuator and anti-gravity device has been described as being suitable for use in allowing a wafer table to move in a Z-direction, such a combination Z-actuator and anti-gravity device is not limited to being used to allow a wafer table to move in a Z-direction. A combination Z-actuator and anti-gravity device may be used to enable movement of substantially any apparatus, e.g., a reticle stage, and may also be moved to enable movement in or about axes other than a z-axis.

A combination Z-actuator and anti-gravity device may be applied to substantially any suitable fine stage, even a fine stage in which guided motion along an x-axis and a y-axis, as well as rotational motion about a z-axis, is not necessary during focus and leveling control. That is, a combination Z-actuator and anti-gravity device may be applied to apparatuses other than a direct drive stage and a stage which has six degrees-of-freedom. For instance, a combination Z-actuator and anti-gravity device may be applied to a vibration isolation system for a machine. It should be appreciated that if a combination Z-actuator and anti-gravity device is to be applied to a direct drive wafer stage, a planar air bearing positioned at the bottom of the combination Z-actuator and anti-gravity device is generally needed to allow for a long stroke planar motion along a guide surface. Further, although a combination Z-actuator and anti-gravity device has been described as suitable for use in driving a fine stage while a bearing surface of the combination Z actuator and anti-gravity device moves over a base member, a combination Z actuator and anti-gravity device may also be used either to drive a coarse stage or to drive a fine stage situated over a coarse stage. In one embodiment, a fine stage that is situated over a coarse stage may be driven by a combination Z-actuator and anti-gravity device such that a planar air bearing positioned at the bottom of the combination Z-actuator and anti-gravity device scans substantially directly over the coarse stage.

While anti-gravity capabilities of an actuator assembly have been described as being provided through the cooperation of pressurized air and a piston assembly, anti-gravity capabilities may be provided in a variety of different ways. By way of example, magnets may be arranged to support a fine stage that is coupled to an actuator assembly against the force of gravity without departing from the spirit or the scope of the present invention. In one embodiment, electromagnets may be positioned in a chamber such as chamber 390 of FIG. 3c, while opposing magnets may be placed on a piston such as piston 394 of FIG. 3c. By altering the current provided to the electromagnets, the amount of attraction or repulsion between the electromagnets and the opposing magnets may cause piston 394 to move as appropriate to support the fine stage against the force of gravity.

In the embodiments described above, pressurized air has been described as being provided to bearings such as bearings 124, 230, 234, 238, 330, 334, and 338 as well as to chambers 280 and 290. It should be appreciated, however, that the invention is not to be construed as being limited to the use of pressurized air for bearings and in the chamber of a combination Z-actuator and anti-gravity device. For instance, instead of air, another fluid or gas such as nitrogen or an inert gas may be used for the bearings and in the chamber. Therefore, the present examples are to be considered as illustrative and not restrictive, and the invention is not to be limited to the details given herein, but may be modified within the scope of the appended claims.

What is claimed is:

1. A device for supporting an object table on a base member, comprising:
   a first member coupled to the object table;
   a second member placed on the base member;
   a voice coil motor arranged between the first member and the second member to generate first supporting force;
   a piston arranged between the first member and the second member to generate a second supporting force; and
   a bearing arrangement, the bearing arrangement being arranged to enable the object table to move with up to approximately six degrees of freedom in relation to the base member, wherein the first member includes a center pole and a yoke coupled to the object table, and wherein the bearing arrangement includes a planar bearing configured between the base member and the second member, a shaft bearing configured between the second member and the center pole, and a spherical bearing configured between the center pole and the yoke.

2. A device for supporting an object table on a base member, comprising:
   a first member coupled to the object table;
   a second member placed on the base member;
   a voice coil motor arranged between the first member and the second member to generate a first supporting force;
   a piston arranged between the first member and the second member to generate a second supporting force; and
   a bearing arrangement, the bearing arrangement being arranged to enable the object table to move with up to approximately six degrees of freedom in relation to the base member, wherein the bearing arrangement includes a planar bearing configured between the base member and the second member, a shaft bearing configured between the second member and the first member, and a spherical bearing configured between the first member and the object table.

3. A device for supporting an object table on a base member, comprising:
   a first member coupled to the object table;
   a second member placed on the base member;
   a voice coil motor arranged between the first member and the second member to generate a first supporting force;
   a piston arranged between the first member and the second member to generate a second supporting force; and
   a bearing arrangement, the bearing arrangement being arranged to enable the object table to move with up to approximately six degrees of freedom in relation to the base member, wherein the bearing arrangement includes a planar bearing, a shaft bearing, and a spherical bearing, and wherein the planar bearing, the shaft bearing, and the spherical bearing are all air bearings.

4. A stage device comprising the device of claim 1.

5. An exposure apparatus comprising the stage device of claim 4.

6. A device for supporting an object table on a base member, comprising:
   a support member movably placed on the base member through a planar bearing configured between the support member and the base member, the support member including a coil arrangement;
   a center pole held by the support member through a shaft bearing configured between the support member and the center pole; and
   a yoke coupled to the center pole, the yoke being arranged to support the object table through a spherical bearing configured between the object table and the yoke, wherein the yoke includes a magnet arrangement, and wherein the coil arrangement and the magnet arrangement compose a first actuator that generates a first supporting force, and the support member and the center pole compose a second actuator that generates a second supporting force.

7. The device of claim 6 wherein the first actuator is a voice coil motor and the second actuator includes a piston.

8. The device of claim 6 wherein the planar bearing enables the support member to move in an X-direction, in a Y-direction, and about a Z-direction in relation to the base member, the shaft bearing being arranged to enable the center pole to move in the Z-direction in relation to the support member, the spherical bearing being arranged to enable the yoke to move about the X-direction and about the Y-direction in relation to the center pole, wherein the first supporting force and the second supporting force are along the Z-direction.

9. A stage device comprising the device of claim 6.

10. An exposure apparatus comprising the stage device of claim 9.

11. A device for supporting an object table on a base member, comprising:
    a support member movably placed on the base member through a planar bearing configured between the support member and the base member, the support member including a coil arrangement;
    a center pole held by the support member through a shaft bearing configured between the support member and the center pole; and
    a yoke coupled to the object table, the yoke supported by the center pole through a spherical bearing configured between the center pole and the yoke, wherein the yoke includes a magnet arrangement, and wherein the coil arrangement and the magnet arrangement compose a first actuator to generate a first supporting force, and the support member and the center pole compose a second actuator to generate a second supporting force.

12. The device of claim 11 wherein the first actuator is a voice coil motor and the second actuator includes a piston.

13. The device of claim 11 wherein the planar bearing enables the support member to move in an X-direction, in a Y-direction, and about a Z-direction in relation to the base member, the shaft bearing being arranged to enable the center pole to move in the Z-direction in relation to the support member, the spherical bearing being arranged to enable the yoke to move about the X-direction and about the Y-direction in relation to the center pole, wherein the first supporting force and the second supporting force are generated along the Z-direction.

14. A stage device comprising the device of claim 11.

15. An exposure apparatus comprising the stage device of claim 14.

16. A stage device comprising:
    a fine stage;
    a base member; and
    an actuator assembly, the actuator assembly including a voice coil motor and a guide bearing arrangement, the actuator assembly being arranged to contact the fine stage and including a center pole and yoke assembly, the actuator assembly further including a piston arrangement that is arranged to substantially support a weight of the fine stage in a z-direction, the guide bearing arrangement including a planar bearing that enables the actuator assembly to move over the base member in an x-direction, in a y-direction, and about the z-direction, wherein the actuator assembly further includes a spherical bearing, the spherical bearing being coupled to the center pole and yoke assembly to enable the center pole and yoke assembly to rotate relative to the fine stage about the x-direction and the y-direction.

17. The stage device of claim 16 wherein the voice coil motor includes a coil and the actuator assembly further includes a coil support arranged to support the coil, and wherein the guide bearing arrangement further includes a cylindrical shaft bearing arranged to enable the center pole and yoke assembly to move relative to the coil support along the z-direction and about the z-direction.

18. An exposure apparatus comprising the stage device of claim 16.

19. A stage device comprising:
a fine stage;
a base member; and
an actuator assembly, the actuator assembly including a voice coil motor and a guide bearing arrangement, the actuator assembly further including a yoke that is coupled to the fine stage and a piston arrangement that is arranged to substantially support a weight of the fine stage in a z-direction, wherein the guide bearing arrangement includes a planar bearing that enables the actuator assembly to move over the base member in an x-direction, in a y-direction, and about the z-direction, and wherein the actuator assembly further includes a center pole, and the guide bearing arrangement includes a spherical bearing, the spherical bearing being coupled to the center pole to enable the center pole to rotate relative to the yoke about the x-direction and the y-direction.

20. The stage device of claim 19 wherein the voice coil motor includes a coil and the actuator assembly further includes a coil support arranged to support the coil, and wherein the guide bearing arrangement further includes a cylindrical shaft bearing arranged to enable the center pole to move relative to the coil support along the z-direction and about the z-direction.

21. The device of claim 19 wherein the yoke is fixably coupled to the fine stage such that the center pole rotates about the x-direction and about the y-direction relative to the fine stage.

22. An exposure apparatus comprising the stage device of claim 19.

23. A device comprising:
a first arrangement, the first arrangement including a yoke and a center pole;
a magnetic system, the magnetic system including at least a magnet and a coil arranged to cooperate to function as a voice coil motor, wherein the magnet is coupled to the yoke;
a piston, wherein the piston is arranged to support at least a weight associated with the first arrangement;
a guide bearing arrangement, the guide bearing arrangement including a planar bearing, the planar bearing being arranged to enable the device to move over an external surface, wherein the guide bearing arrangement further includes a cylindrical shaft bearing, the cylindrical shaft bearing being arranged to enable the center pole to translate along a z-axis and about the z-axis relative to the coil support and a spherical bearing, the spherical bearing being coupled to the center pole; and
a coil support, the coil support being arranged to support the coil.

24. The device of claim 23 wherein the spherical bearing is arranged to enable the center pole to rotate about an x-axis and about a y-axis relative to the yoke.

25. A device comprising:
a first arrangement, the first arrangement including a yoke and a center pole, wherein the yoke and the center pole are formed as a substantially single piece;
a magnetic system, the magnetic system including at least a magnet and a coil arranged to cooperate to function as a voice coil motor, wherein the magnet is coupled to the yoke;
a piston, wherein the piston is arranged to support at least a weight associated with the first arrangement; and
a guide bearing arrangement, the guide bearing arrangement including a planar bearing, the planar bearing being arranged to enable the device to move over an external surface.

26. The device of claim 25 wherein the planar bearing is arranged to enable the device to move over the external surface along an x-axis, along a y-axis, and about a z-axis.

27. The device of claim 25 wherein the guide bearing arrangement includes a planar fluid bearing, and the device further includes a fluid inlet, the fluid inlet being arranged to provide fluid that acts on the piston to support the weight of at least the first arrangement relative to a z-axis and fluid that supplies the guide bearing arrangement.

28. The device of claim 25 wherein the planar bearing is provided at a bottom of the device.

* * * * *